United States Patent [19]
Manning

[11] Patent Number: 5,721,859
[45] Date of Patent: Feb. 24, 1998

[54] COUNTER CONTROL CIRCUIT IN A BURST MEMORY

[75] Inventor: Troy A. Manning, Boise, Id.

[73] Assignee: Micron Technology, Inc., Boise., Id.

[21] Appl. No.: 553,156

[22] Filed: Nov. 7, 1995

Related U.S. Application Data

[63] Continuation-in-part of Ser. No. 457,651, Jun. 1, 1995, which is a continuation-in-part of Ser. No. 386,894, Feb. 10, 1995, Pat. No. 5,610,864, which is a continuation-in-part of Ser. No. 370,761, Dec. 23, 1994, Pat. No. 5,526,320.

[51] Int. Cl.$^6$ .................... G06F 9/26; G06F 12/00
[52] U.S. Cl. .................. 397/421.07; 395/421.08; 395/401; 365/233; 365/189.05; 365/230.01
[58] Field of Search .............. 395/421.07, 421.08, 395/421.09, 421.1; 365/233, 222, 233.5, 189.05, 230.08, 421.07, 421.08, 401

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/900 |
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,788,667 | 11/1988 | Nakano | 365/193 |
| 4,870,622 | 9/1989 | Aria et al. | 365/230 |
| 4,875,192 | 10/1989 | Matsumoto | 365/193 |
| 4,984,217 | 1/1991 | Sato | 365/230 |
| 5,058,066 | 10/1991 | Yu | 365/189.05 |
| 5,126,975 | 6/1992 | Handy et al. | 365/230 |
| 5,210,723 | 5/1993 | Bates et al. | 365/238.5 |
| 5,267,200 | 11/1993 | Tobita | 365/189 |
| 5,268,865 | 12/1993 | Takasugi | 365/189 |
| 5,280,594 | 1/1994 | Young et al. | |
| 5,305,284 | 4/1994 | Iwase | 365/238.5 |
| 5,319,759 | 6/1994 | Chan | 395/421.07 |
| 5,325,330 | 6/1994 | Morgan | 365/189.05 |
| 5,325,502 | 6/1994 | McLaury | 395/425 |
| 5,349,566 | 9/1994 | Merritt et al. | 365/233.5 |
| 5,357,469 | 10/1994 | Sommer et al. | 365/193 |
| 5,373,227 | 12/1994 | Keeth | 323/313 |
| 5,379,261 | 1/1995 | Jones, Jr. | 365/230 |
| 5,392,239 | 2/1995 | Margulis et al. | 365/189 |
| 5,410,670 | 4/1995 | Hansen et al. | 395/425 |
| 5,452,261 | 9/1995 | Chung et al. | 365/233 |
| 5,457,659 | 10/1995 | Schaefer | 365/222 |
| 5,483,498 | 1/1996 | Hotta | 365/233.5 |
| 5,485,428 | 1/1996 | Lin | 365/221 |
| 5,526,320 | 6/1996 | Zagar et al. | 365/233.5 |

FOREIGN PATENT DOCUMENTS 19507562  9/1995  Germany.

OTHER PUBLICATIONS

"DRAM 1 Meg ×4 DRAM 5VEDO Page Mode", *1995 DRAM Data Book*, pp. 1–1 thru 1–30, (Micron Technology, I).

"Rossini, Pentium, PCI–ISA, Chip Set", *Symphony Laboratories*, entire book.

(List continued on next page.)

*Primary Examiner*—David K. Moore
*Assistant Examiner*—Than V. Nguyen
*Attorney, Agent, or Firm*—Schwegman, Lundberg, Woessner & Kluth, P.A.

[57] ABSTRACT

An integrated memory circuit is described which can be operated in a burst access mode. The memory circuit includes an address counter which changes column addresses in one of a number of predetermined patterns. The column address is changes in response to a rising edge of a column address signal (CAS*). The memory also includes a buffer circuit which latches the output of the address counter in response to the falling edge of the column address signal. Memory cells are accessed in a burst manner on the falling edge of the column address signal using the address latched in the buffer.

22 Claims, 12 Drawing Sheets

OTHER PUBLICATIONS

"4DRAM 1991", *Toshiba America Electronic Components, Inc.*, pp. A–137–A–159.

"Application Specific DRAM", *Toshiba America Electronic Components, Inc.*, C178, C–260, C 218, (1994).

"Burst DRAM Function & Pinout", *Oki Electric Ind., Co., Ltd., 2nd Presentation, Item #619*, (Sep. 1994).

"Hyper Page Mode DRAM", 8029 *Electronic Engineering*, 66, No. 813, Woolwich, London, GB, pp. 47–48, (Sep. 1994).

"Mosel–Vitelic V53C8257H DRAM Specification Sheet, 20 pages, Jul. 2, 1994".

"Pipelined Burst DRAM", *Toshiba, JEDEC JC 42.3 Hawaii*, (Dec. 1994).

"Samsung Synchronous DRAM", *Samsung Electronics*, pp. 1–16, (Mar. 1993).

"Synchronous DRAM 2 Meg × 8 SDRAM", *Micron Semiconductor, Inc.*, pp. 2–43 through 2–8.

Dave Bursky, "Novel I/O Options and Innovative Architectures Let DRAMs Achieve SRAM Performance; Fast DRAMS can be swapped for SRAM Caches", *Electronic Design*, vol. 41, No. 15, Cleveland, Ohio, pp. 55–67, (Jul. 22, 1993).

Shiva P. Gowni, et al., "A 9NS, 32K × 9, BICMOS TTL Synchronous Cache RAM With Burst Mode Access", IEEE, Custom Integrated Circuits Conference, pp. 781–786, (Mar. 3, 1992).

"Synchronous DRAM 2MEG× 8 SDRAM", Micron Semiconductor Inc., Mar. 1994.

"Pipelined Burst DRAM", Toshiba, JEDEC JC 43.2 Hawaii, Dec. 1994.

| Burst Length | Starting Column Address | | | Linear | Interleave |
|---|---|---|---|---|---|
| | A2 | A1 | A0 | | |
| 2 | V | V | 0 | 0-1 | 0-1 |
| | V | V | 1 | 1-0 | 1-0 |
| 4 | V | 0 | 0 | 0-1-2-3 | 0-1-2-3 |
| | V | 0 | 1 | 1-2-3-0 | 1-0-3-2 |
| | V | 1 | 0 | 2-3-0-1 | 2-3-0-1 |
| | V | 1 | 1 | 3-0-1-2 | 3-2-1-0 |
| 8 | 0 | 0 | 0 | 0-1-2-3-4-5-6-7 | 0-1-2-3-4-5-6-7 |
| | 0 | 0 | 1 | 1-2-3-4-5-6-7-0 | 1-0-3-2-5-4-7-6 |
| | 0 | 1 | 0 | 2-3-4-5-6-7-0-1 | 2-3-0-1-6-7-4-5 |
| | 0 | 1 | 1 | 3-4-5-6-7-0-1-2 | 3-2-1-0-7-6-5-4 |
| | 1 | 0 | 0 | 4-5-6-7-0-1-2-3 | 4-5-6-7-0-1-2-3 |
| | 1 | 0 | 1 | 5-6-7-0-1-2-3-4 | 5-4-7-6-1-0-3-2 |
| | 1 | 1 | 0 | 6-7-0-1-2-3-4-5 | 6-7-4-5-2-3-0-1 |
| | 1 | 1 | 1 | 7-0-1-2-3-4-5-6 | 7-6-5-4-3-2-1-0 |

FIG. 2

COUNTER CONTROL CIRCUIT IN A BURST MEMORY

This application is a continuation-in-part of U.S. application Ser. No. 08/457,651, filed Jun. 1, 1995, entitled "Burst EDO Memory Device Address Counter" which is a continuation-in-part of U.S. application Ser. No. 08/386,894, filed Feb. 10, 1995, now U.S. Pat. No. 5,610,864, entitled "Burst EDO Memory Device with Maximum Write Cycle Timing" which is a continuation-in-part of U.S. application Ser. No. 08/370,761, filed of Dec. 23, 1994, now U.S. Pat. No. 5,526,320, and entitled "Burst EDO Memory Device," all of which are incorporated herein by reference.

FIELD OF THE INVENTION

This invention relates to internal address generation circuits and counter circuits for memory devices with burst access capability.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (RAS*) is used to latch a row address portion of a multiplexed DRAM address. Multiple occurrences of the column address strobe (CAS*) are then used to latch multiple column addresses to access data within the selected row. On the falling edge of CAS* an address is latched, and the DRAM outputs are enabled. When CAS* transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. CAS* may be low for as little as 15 nanoseconds, and the data access time from CAS* to valid output data (tCAC) may be up to 15 nanoseconds; therefore, in a worst case scenario there is no time to latch the output data external to the memory device. For devices that operate faster than the specifications require, the data may still only be valid for a few nanoseconds. On a heavily loaded microprocessor memory bus, trying to latch an asynchronous signal that is valid for only a few nanoseconds is very difficult. Even providing a new address every 35 nanoseconds requires large address drivers which create significant amounts of electrical noise within the system. To increase the data throughput of a memory system, it has been common practice to place multiple devices on a common bus. For example, two fast page mode DRAMs may be connected to common address and data buses. One DRAM stores data for odd addresses, and the other for even addresses. The CAS* signal for the odd addresses is turned off (high) when the CAS* signal for the even addresses is turned on (low). This interleaved memory system provides data access at twice the rate of either device alone. If the first CAS* is low for 20 nanoseconds and then high for 20 nanoseconds while the second CAS* goes low, data can be accessed every 20 nanoseconds or 50 megahertz. If the access time from CAS* to data valid is fifteen nanoseconds, the data will be valid for only five nanoseconds at the end of each 20-nanosecond period when both devices are operating in fast page mode. As cycle times are shortened, the data valid period goes to zero.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after CAS* goes high until sometime after the next CAS* low pulse occurs, or until RAS* or the output enable (OE*) goes high. Determining when valid data will arrive at the outputs of a fast page mode or EDO DRAM can be a complex function of when the column address inputs are valid, when CAS* falls, the state of OE* and when CAS* rose in the previous cycle. The period during which data is valid with respect to the control line signals (especially CAS*) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM) for example has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

In order for existing computer systems to use an improved device having a nonstandard pinout, those systems must be extensively modified. Additionally, existing computer system memory architectures are designed such that control and address signals may not be able to switch at the frequencies required to operate the new memory device at high speed due to large capacitive loads on the signal lines. The Single In-Line Memory Module (SIMM) provides an example of what has become an industry standard form of packaging memory in a computer system. On a SIMM, all address lines connect to all DRAMs. Further, the row address strobe (RAS*) and the write enable (WE*) are often connected to each DRAM on the SIMM. These lines inherently have high capacitive loads as a result, of the number of device inputs driven by them. SIMM devices also typically ground the output enable (OE*) pin making OE* a less attractive candidate for providing extended functionality to the memory devices.

There is a great degree of resistance to any proposed deviations from the standard SIMM design due to the vast number of computers which use SIMMs. Industry's resistance to radical deviations from the standard, and the inability of current systems to accommodate the new memory devices will delay their widespread acceptance. Therefore only limited quantities of devices with radically different architectures will be manufactured initially. This limited manufacture prevents the reduction in cost which typically can be accomplished through the manufacturing improvements and efficiencies associated with a high volume product.

What is needed, therefore, is an integrated memory device which has a standard DRAM pinout and both operates at high data speed and is compatible with existing memory systems. Further, internal address generation circuits and counters are needed to efficiently operate these high data rate memories.

SUMMARY OF THE INVENTION

The above mentioned problems with high data rate memory devices and other problems are addressed by the present invention and which will be understood by reading and studying the following specification. A memory device is described which operates in a burst access mode which includes counter control circuitry that advances a memory column address on one transition of a latch signal and access the memory column address on another transition of the latch signal.

In particular, the present invention describes a memory device having a plurality of addressable memory elements comprising an address counter to receive a first memory element address and adapted to generate a series of memory element addresses in response to a first transition direction of an address latch signal, and a buffer circuit to latch the series of memory element addresses in response to a second transition direction of the address latch signal. In one embodiment, the address latch signal can be an active low column address signal (CAS*) and the first transition direction of the address latch signal is a low to high transition in the CAS*. The second transition direction of the address latch signal is a high to low transition in the CAS*.

In another embodiment, an integrated memory circuit comprises a memory array having a plurality of addressable memory cells, and an address counter to receive a first memory cell address and adapted to generate a series of memory cell addresses in response to a first transition direction of an address latch signal. The integrated memory also comprises a buffer circuit coupled to the address counter to latch either the first memory cell address or the series of memory cell addresses in response to a second transition direction of the address latch signal, and access circuitry to access the memory array in response to an address latched in the buffer circuit. The buffer circuit can comprise a first multiplexer circuit having a first input coupled to an output of the address counter, a feed back circuit coupled a second input of the first multiplexer circuit, and a latch circuit adapted to receive an output of the first multiplexer. In another embodiment, the buffer circuit further comprises a second multiplexer circuit having a first input coupled to an external address input and a second input coupled to the output of the first multiplexer. In yet another embodiment, the address counter comprises a plurality of flip flops, a shift register coupled to the plurality of flip flops, and a multiplexer for enabling one of a plurality of counting sequences.

In still another embodiment, a method is described for accessing memory elements in a memory device. The method comprises the steps of latching a first memory element address in an address counter, generating a series of memory element addresses with the address counter in response to a first transition direction of an address latch signal, and latching the series of memory element addresses with a buffer circuit in response to a second transition direction of the address latch signal. The method can further include the step of accessing a memory element based upon the series of memory element addresses latched in the buffer in response to the second transition direction of the address latch signal.

BRIEF DESCRIPTION OF THE DRAWINGS

FIG. 2 is a table showing linear and interleaving addressing formats;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
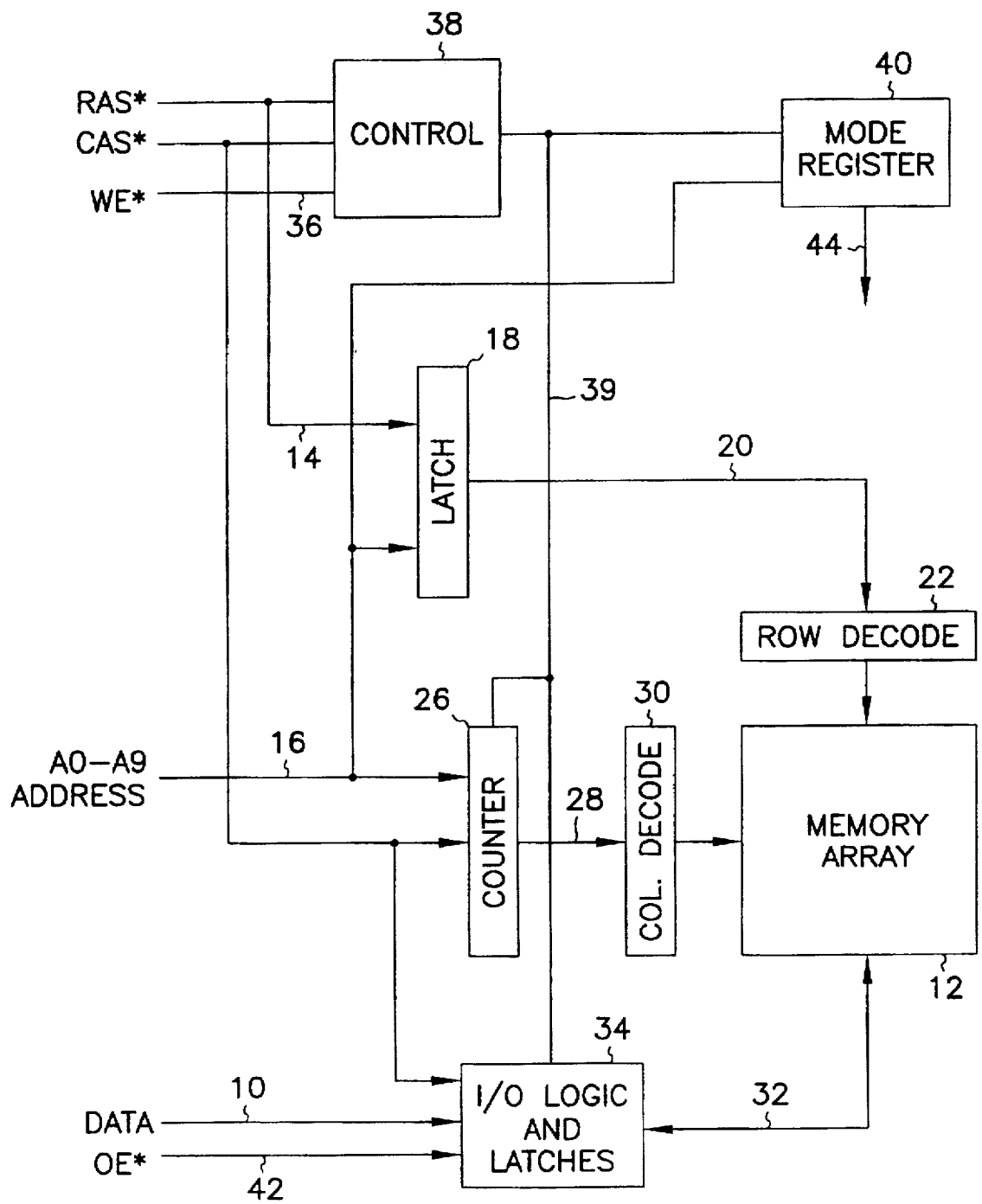
FIG. 1 is a is a schematic diagram of a memory device in accordance with one embodiment of the present invention.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 may have an industry standard pinout for eight bit wide EDO DRAMs. An active-low row address strobe (RAS*) signal 14 is used to latch a first portion of a multiplexed memory address, from address inputs 16, in latch 18. The latched row address 20 is decoded in row decoder 22. The decoded row address is used to select a row of the memory array 12. A column address strobe (CAS*) signal 24 is used to latch a second portion of a memory address from address inputs 16 into address generation circuit 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches. Data 10 driven from the burst EDO DRAM may be latched external to the device in synchronization with CAS* after a predetermined number of CAS* cycle delays (latency). For a two cycle latency design, the first CAS* falling edge is used to latch the initial address for the burst access. The first burst data from the memory is driven from the memory after the second CAS* falling edge, and remains valid through the third CAS* falling edge. Once the memory device begins to output data in a burst read cycle, the output drivers 34 will continue to drive the data lines without tri-stating the data outputs during CAS* high intervals dependent on the state of the output enable and write enable (OE* and WE*) control lines, thus allowing additional time for the system to latch the output data. The data outputs remain valid throughout the burst read cycles with the exception of brief periods of data transition. During these periods of data transition, the output drivers may be turned off momentarily in order to aid data transition. This state of the output buffer should not be confused with the standard DRAM tri-state condition which is intended to release the data bus.

Once a row and a column address are selected, additional transitions of the CAS* signal are used to advance the column address within the address generation circuit in a predetermined sequence. The time at which data will be valid at the outputs of the burst EDO DRAM is dependent only on the timing of the CAS* signal provided that OE* is maintained low, and WE* remains high. The output data signal levels may be but are not limited to being driven in accordance with standard CMOS, TTL, LVTTL, GTL, or HSTL output level specifications.

The address may be advanced linearly, or in an interleaved fashion for maximum compatibility with the overall system requirements. FIG. 2 is a table which shows linear and interleaved addressing sequences for burst lengths of 2, 4 and 8 cycles. The "V" for starting addresses A1 and A2 in the table represent address values that remain unaltered through the burst sequence. The column address may be advanced with each CAS* transition, each pulse, or multiple of CAS* pulses in the event that more than one data word is read from the array with each column address. When the address is advanced with each transition of the CAS* signal, data is also driven from the part after each transition following the device latency which is then referenced to each edge of the CAS* signal. This allows for a burst access cycle where the highest switching control line (CAS*) toggles only once (high to low or low to high) for each memory cycle. This is in contrast to standard DRAMs which require CAS* to go low and then high for each cycle, and synchronous DRAMs which require a full clock cycle (high and low transitions) for each memory cycle. For maximum compatibility with existing EDO DRAM devices, the invention will be further described in reference to a device designed to latch and advance a column address on falling edges of the CAS* signal.

In the burst access memory device, each new column address from the address generation circuit is decoded and is used to access additional data within the memory array without the requirement of additional column addresses being specified on the address inputs 16. This burst sequence of data will continue for each CAS* falling edge until a predetermined number of data accesses equal to the burst length has occurred. A CAS* falling edge received after the last burst address has been generated will latch another column address from the address inputs 16 and a new burst sequence will begin. Read data is latched and output with each falling edge of CAS* after the first CAS* latency.

For a burst write cycle, data 10 is latched in input data latches 34. Data targeted at the first address specified by the row and column addresses is latched with the CAS* signal when the first column address is latched (write cycle data latency is zero). Other write cycle data latency values are possible; however, for today's memory systems, zero is preferred. Additional input data words for storage at incremented column address locations are latched by CAS* on successive CAS* pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occurred, a subsequent CAS* pulse will latch a new beginning column address, and another burst read or write access will begin.

The write enable signal is used in burst access cycles to select read or write burst accesses when the initial column address for a burst cycle is latched by CAS*. WE* low at the column address latch time selects a burst write access. WE* high at the column address latch time selects a burst read access. The level of the signal must remain high for read and low for write burst accesses throughout the burst access. A low to high transition within a burst write access will terminate the burst access, preventing further writes from occurring. A high to low transition on WE* within a burst read access will likewise terminate the burst read access and will place the data output 10 in a high impedance state. Transitions of the WE* signal may be locked out during critical timing periods within an access cycle in order to reduce the possibility of triggering a false write cycle. After the critical timing period the state of WE* will determine whether a burst access continues, is initiated, or is terminated. Termination of a burst access places the DRAM in a state to receive another burst access command. Both RAS* and CAS* going high during a burst access will also terminate the burst access cycle and place the data drivers in a high impedance output state. Read data may remain valid at the device outputs if RAS* alone goes high while CAS* is active for compatibility with hidden refresh cycles, otherwise RAS* high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, WE* will transition from high to low to terminate a first burst read, and then WE* will transition back high prior to the next falling edge of CAS* in order to specify a new burst read cycle. For burst writes, WE* would transition high to terminate a current burst write access, then back low prior to the next falling edge of CAS* to initiate another burst write access. A basic implementation of the device of FIG. 1 may include a fixed burst length of 4, a fixed CAS* latency of 2 and a programmable sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (OE*) to be grounded for compatibility with many SIMM module designs. When not disabled (tied to ground), OE* is an asynchronous control which will prevent data from being driven from the part in a read cycle if it is inactive (high) prior to CAS* falling and remains inactive beyond CAS* rising. If these setup and hold conditions are not met, then the read data may be driven for a portion of the read cycle. It is possible to synchronize the OE* signal with CAS*, however this would typically increase the CAS* to data valid delay time and doesn't allow for the read data to be disabled prior to RAS* high without an additional CAS* low pulse which would otherwise be unnecessary. In a preferred embodiment, if OE* transitions high at any time during a read cycle the outputs will remain in a high impedance state until the next falling edge of CAS* despite further transitions of the OE* signal.

Programmability of the burst length, CAS* latency and address sequences may be accomplished through the use of a mode register 40 which latches the state of one or more of the address input signals 16 or data signals 10 upon receipt of a write-CAS*-before-RAS* (WCBR) programming cycle. In such a device, outputs 44 from the mode register control the required circuits on the DRAM. Burst length options of 2, 4, 8 and full page as well as CAS* latencies of 1, 2 and 3 may be provided. Other burst length and latency options may be provided as the operating speeds of the device increase, and computer architectures evolve. The device of FIG. 1 includes programmability of the address sequence by latching the state of the least significant address bit during a WCBR cycle. Additional input signals may be used to decode an enable for setting the address sequence. For example, a specific value received on address lines A1–A7 in a WCBR cycle is decoded to specify that the sequence mode is to be set, and the state of A0 is used to specify which mode is selected. The burst length and CAS* latency for this particular embodiment are fixed. Other possible alterations in the feature sets of this DRAM include having a fixed burst mode only, selecting between standard fast page mode (non-EDO) and burst mode, and using the output enable (OE*) 42 in combination with RAS* to select between modes of operation. Also, a WCBR refresh cycle could be used to select the mode of operation rather than a control signal in combination with RAS*. A more complex memory device may provide additional modes of operation such as switching between fast page mode, EDO page mode, static column mode and burst operation through the use of various combinations of WE* and OE* at RAS* falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

The present invention is described with reference to several preferred embodiments. Just as fast page mode DRAMs and EDO DRAMs are available in numerous configurations including x1, x4, x8 and x16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of all of the various memory device organizations applicable to this invention are not necessary.

A preferred pinout for the device of FIG. 1 is identical to the pinout for a standard EDO DRAM. The common pinout allows this new device to be used in existing memory designs with minimum design changes. The common pinout also allows for ease of new designs by those of skill in the art who are familiar with the standard EDO DRAM pinout. Variations of the described invention which maintain the standard EDO DRAM pinout include driving the CAS* pin with a system clock signal to synchronize data access of the memory device with the system clock. For this embodiment, it may be desirable to use the first CAS* active edge after RAS* falls to latch the row address, a later edge may be used to latch the first column address of a burst access cycle. After row and column addresses are latched within the device, the address may be incremented internally to provide burst access cycles in synchronization with the system clock. Other pin function alternatives include driving the burst address incrementing signal on the OE* pin since the part does not require a data output disable function on this pin. Other alternate uses of the OE* pin also allow the device to maintain the standard EDO pinout, but provide increased functionality such as burst mode access. The OE* pin may be used to signal the presence of a valid column starting address, or to terminate a burst access. Each of these embodiments provides for a high speed burst access memory device which may be used in current memory systems with a minimum amount of redesign.

Figure 3:
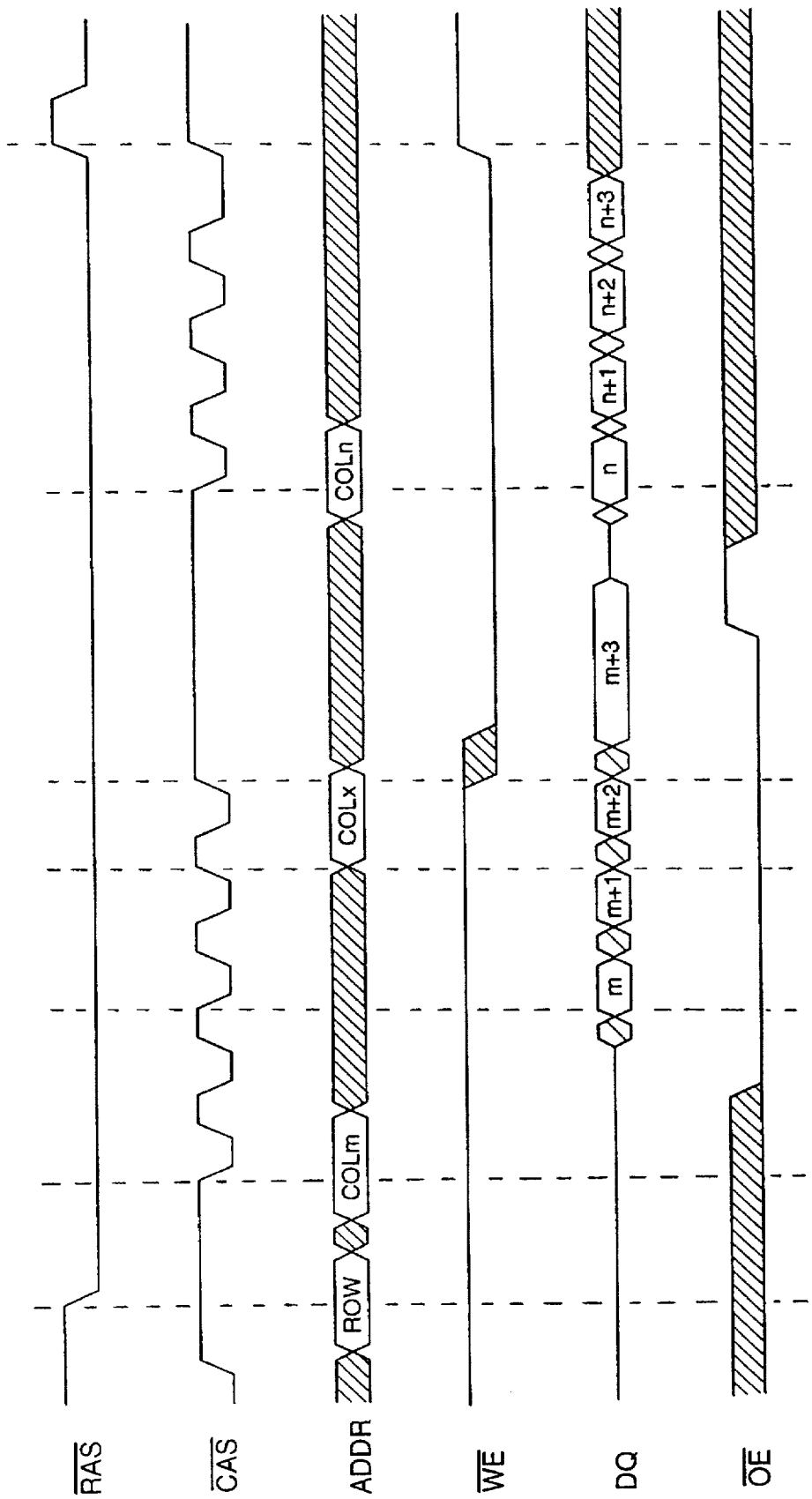
FIG. 3 is a timing diagram for a method of accessing the device of FIG. 1.

FIG. 3 is a timing diagram for performing a burst read followed by burst write of the device of FIG. 1. In FIG. 3, a row address is latched by the RAS* signal. WE* is low when RAS* falls for an embodiment of the design where the state of the WE* pin is used to specify a burst access cycle at RAS* time. Next, CAS* is driven low with WE* high to initiate a burst read access, and the column address is latched. The data out signals (DQ's) are not driven in the first CAS* cycle. On the second falling edge of the CAS* signal the first data out is driven from the device after a CAS* to data access time (tCAC). Additional burst access cycles continue, for a device with a specified burst length of four, until the fifth falling edge of CAS* which latches a new column address for a new burst read access. WE* falling in the fifth CAS* cycle terminates the burst access, and initializes the device for additional burst accesses. The sixth falling edge of CAS* with WE* low is used to latch a new burst address, latch input data and begin a burst write access of the device. Additional data values are latched on successive CAS* falling edges until RAS* rises to terminate the burst access.

Figure 4:
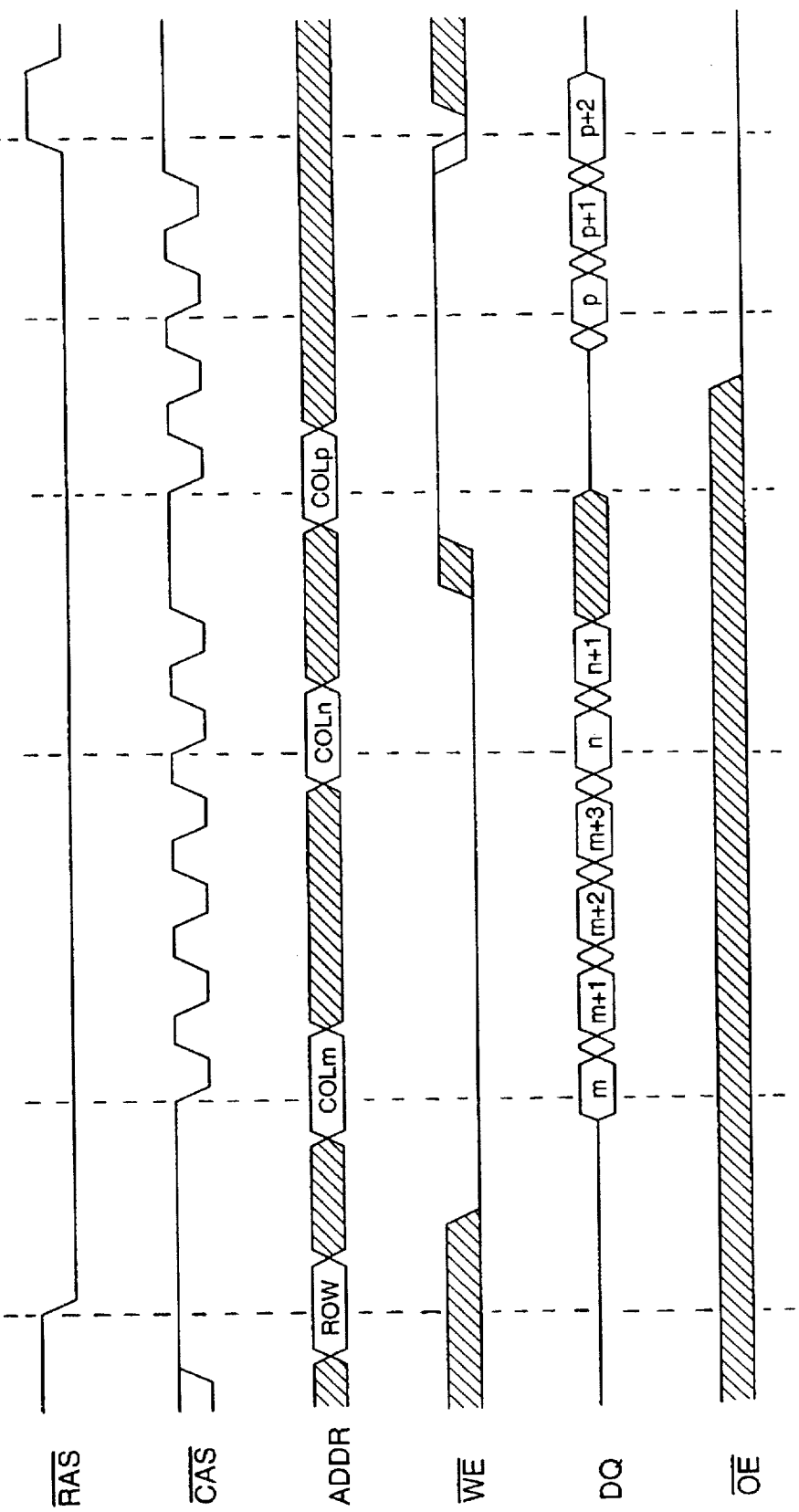
FIG. 4 is a timing diagram for a method of accessing the device of FIG. 1.

FIG. 4 is a timing diagram depicting burst write access cycles followed by burst read cycles. As in FIG. 3, the RAS* signal is used to latch the row address. WE* is shown as a "don't care" at the time RAS* falls for an embodiment of the present invention that does not utilize the state of WE* at RAS* time to select between burst and non-burst access modes. The first CAS* falling edge in combination with WE* low begins a burst write access with the first data being latched. Additional data values are latched with successive CAS* falling edges, and the memory address is advanced internal to the device in either an interleaved or sequential manner. On the fifth CAS* falling edge a new column address and associated write data are latched. The burst write access cycles continue until the WE* signal goes high in the sixth CAS* cycle. The transition of the WE* signal terminates the burst write access. The seventh CAS* low transition latches a new column address and begins a burst read access (WE* is high). The burst read continues until RAS* rises terminating the burst cycles.

It should be noted from FIGS. 3 and 4, that for burst read cycles the data remains valid on the device outputs as long as the OE* pin is low, except for brief periods of data transition. Also, since the WE* pin is low prior to or when CAS* falls, the data input/output lines are not driven from the part during write cycles, and the OE* pin may be grounded. Only the CAS* signal and the data signals toggle at relatively high frequency, and no control signals other than CAS* are required to be in an active or inactive state for one CAS* cycle time or less. This is in contrast to SDRAMs which often require row address strobes, column address strobes, data mask, and read/write control signals to be valid for one clock cycle or less for various device functions. Typical DRAMs also allow for the column address to propagate through to the array to begin a data access prior to CAS* falling. This is done to provide fast data access from CAS* falling if the address has been valid for a sufficient period of time prior to CAS* falling for the data to have been accessed from the array. In these designs an address transition detection circuit is used to restart the memory access if the column address changes prior to CAS* falling. This method actually requires additional time for performing a memory access since it must allow for a period of time at the beginning of each memory cycle after the last address transition to prepare for a new column address. Changes in the column address just prior to CAS* falling may increase the access time by approximately five nanoseconds. An embodiment of the present invention will not allow the column address to propagate through to the array until after CAS* has fallen. This eliminates the need for address transition detection circuitry, and allows for a fixed array access relative to CAS*.

Figure 5:
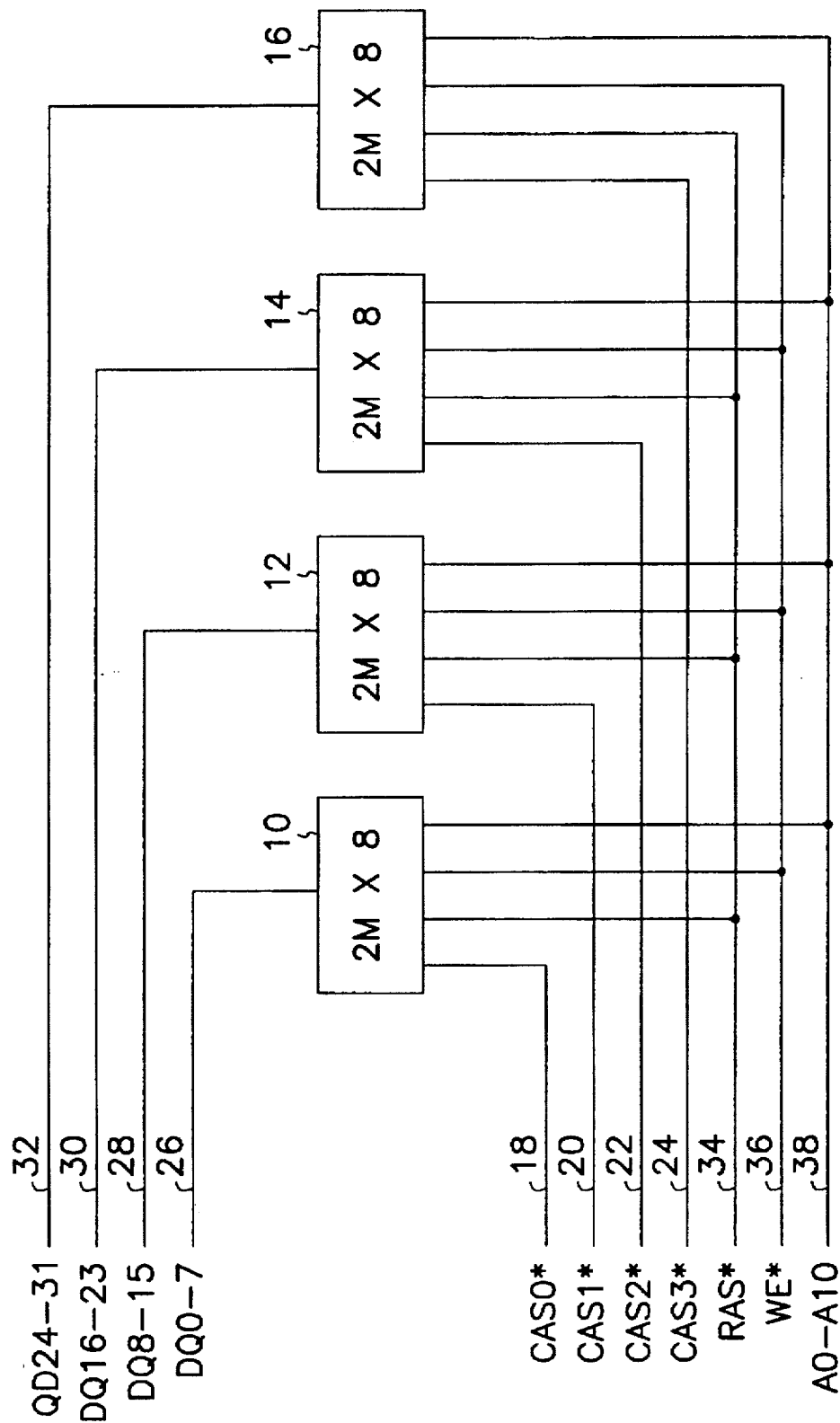
FIG. 5 is a schematic of a Single In-Line Memory Module (SIMM) in accordance with the present invention.

FIG. 5 is a schematic representation of a single in-line memory module (SIMM) designed in accordance with the present invention. The SIMM has a standard SIMM module pinout for physical compatibility with existing systems and sockets. Functional compatibility with EDO page mode SIMMs is maintained when each of the 2 Meg×8 memory devices 10, 12, 14 and 16 are operated in an EDO page mode. Each of the CAS* signals 18, 20, 22 and 24 control one byte width of the 32 bit data bus 26, 28, 30 and 32. A RAS* 34 signal is used to latch a row address in each of the memory devices, and is optionally used in combination with WE* 36 to select between page mode and burst mode access cycles. Address signals 16 provide a multiplexed row and column address to each memory device on the SIMM. In burst mode, only active CAS* control lines are required to toggle at the operating frequency of the device, or at half the frequency if each edge of the CAS* signal is used as described above. The data lines are required to be switchable at half of the frequency of the CAS* lines or at the same frequency, and the other control and address signals switch at lower frequencies than CAS* and the data lines. As shown in FIG. 5, each CAS* signal and each data line is connected to a single memory device allowing for higher frequency switching than the other control and address signals. Each of the memory devices 10, 12, 14 and 16 is designed in accordance with the present invention allowing for a burst mode of operation providing internal address generation for sequential or interleaved data access from multiple memory address locations with timing relative to the CAS* control lines after a first row and column address are latched.

BURST ADDRESS COUNTER

Figure 6:
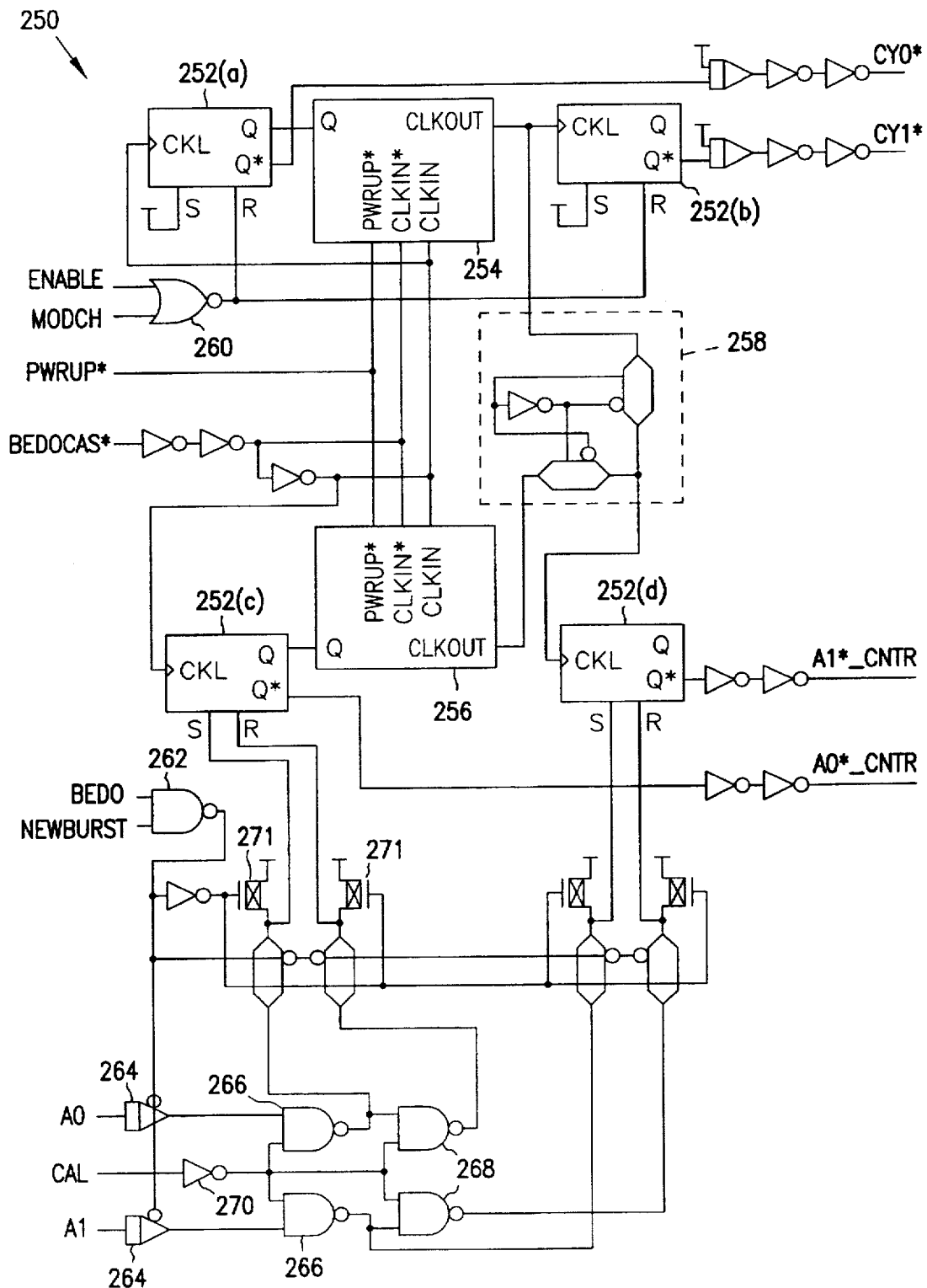
FIG. 6 is a schematic of a counter circuit of FIG. 1.
Figure 7:
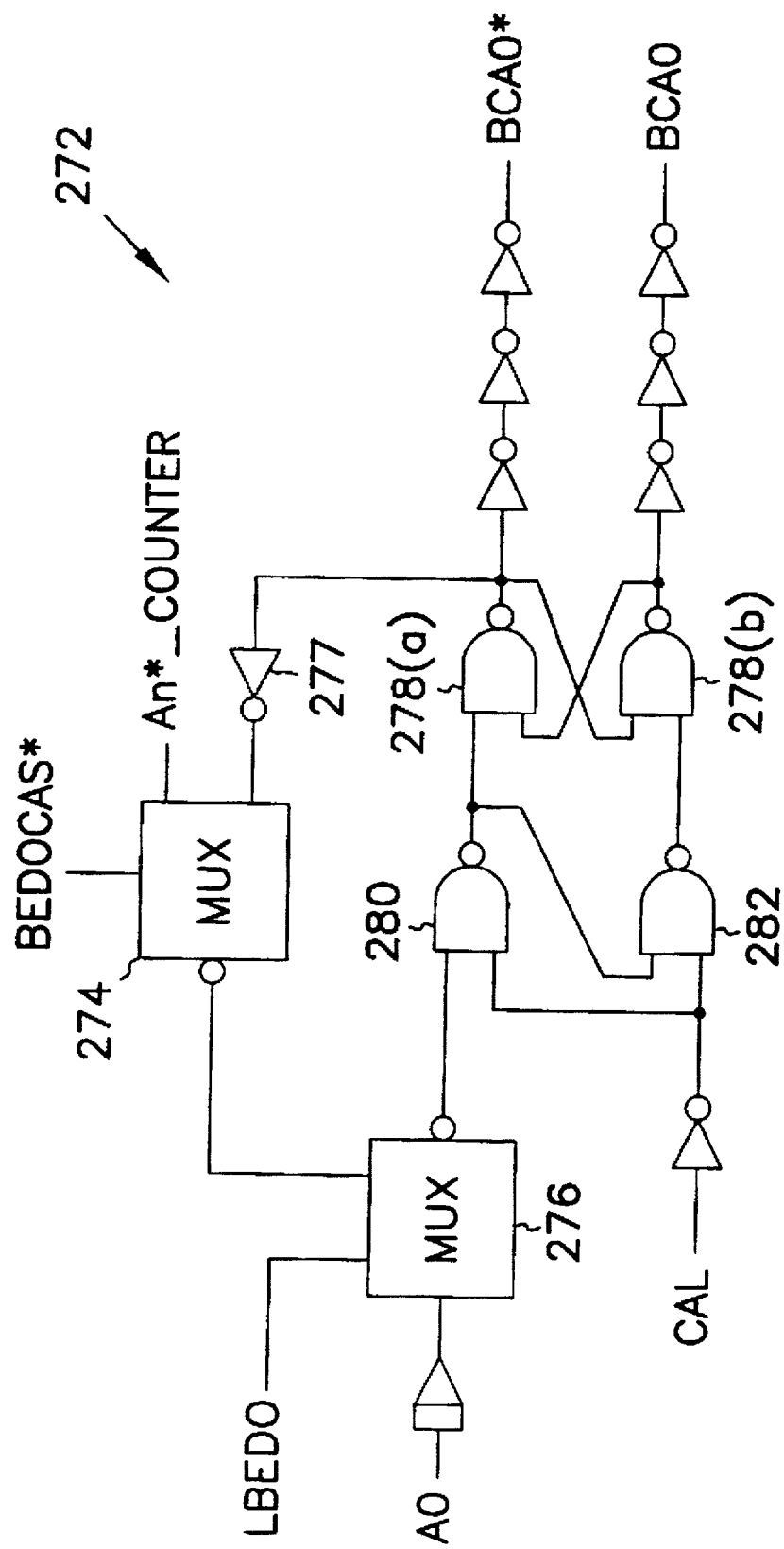
FIG. 7 is a buffer circuit of FIG. 1.

FIGS. 6 and 7 illustrate one embodiment of a two bit address counter included in the address generation circuit 26 of FIG. 1. The two bit burst address counter is comprised of a BEDO counter circuit 250 and two buffer circuits 272. The BEDO counter circuit 250 shown in FIG. 6 produces two counter bits, A0*_CNTR and A1*_CNTR, for a BEDO memory which has a burst length of four. Four clocked flip-flops 252(a)-(d) are used to produce the linear or interleaved count described above with reference to FIG. 2. The Q and Q* outputs of the flip-flops will toggle, if the R and S inputs are high, on a falling edge of a clock signal provided on the clock input. BEDOCAS is, therefore, used as the clock inputs to flip-flops 252(a) and (c) so that the flip-flops will advance on the rising edge of BEDOCAS*. Shift registers 254 and 256 are used to generate the clock signals for flip-flops 252(b) and (d). Multiplexer circuit 258 is used to switch the counter between linear and interleave mode by coupling either shift register 256 or 254 to flip-flop 252(d).

The output of NOR gate 260 is connected to the R input of flip-flops 252(a) and (b) and will be high when both the Enable and MODCH signals are low. The Enable signal is low when the columns of the memory array 12 are powered. The MODCH signal is used to indicate when a change in the BEDO mode (read or write) is initiated. The Q outputs of flip-flop 252 (a) will toggle on every clock signal and flip-flop 252(b) will toggle on ever-other clock signal. The outputs CY0* and CY1* are used to count to four. These outputs indicate, therefore, when the counter circuit 250 has completed four burst steps.

Flip-flops 252(c) and (d) operate in a similar manner, but start at an externally input column address and can count either linearly or interleaved. NAND gate 262 is provided as a means to couple the R and S inputs of flip-flops 252(c) and (d) either the external addresses A0 and A1 or to a high voltage level. The BEDO signal is an internal memory signal which indicates that the memory is operating in a BEDO state, and the NEWBURST signal indicates when a new data burst is initiated. The new data burst can be initiated by a variety of events, such as a mode change, following an interrupt in the burst operation, or after a completed burst sequence. When both BEDO and NEWBURST are high the output of NAND gate 262 is low. Buffers 264 are enable so that addresses A0 and A1 are coupled to NAND gates 266 which in turn are coupled to NAND gates 268. The outputs of NAND gates 266 and 268 are coupled to the S and R inputs of flip-flops 252(c) and (d) to provide the initial column address for the start of a burst sequence. Column address latch input (CAL) can be selectively used to block changes in the external addresses A0 and A1 from effecting the counter circuit.

The first rising edge of BEDOCAS* couples addresses A0 and A1 to the counter address A0*_CNTR and A1*_CNTR through flip-flops 252(c) and (d). NEWBURST goes low to isolate the address inputs A0 and A1 from the flip-flops. NEWBURST also activates pull-up transistors 271. On the second, third and fourth clock signals, flip-flops 252(c) and (d) will advance either linearly or in an interleave pattern from the initial external column address.

Buffer circuit 272 illustrated in FIG. 7 is also included in address generation circuit 26 of FIG. 1. The buffer circuit 272 latches counter address A0*_CNTR, produced by circuit 250 described above, when BEDOCAS* is high. A new A0*_CNTR signal is coupled to outputs BCA0* and BCA0 on the falling edge of BEDOCAS*. While only one buffer circuit 272 is described, it will be understood that the memory includes a buffer circuit for each of the address bits which are advanced by the counter, A0 and A1 in the embodiment shown in FIG. 6.

Multiplexer 276, in response to LBEDO, couples either external address A0 to the input of NAND gate 280 or the output of multiplexer 274. Multiplexer 274, likewise, couples either A0*_CNTR or the output of feed-back inverter 277 to an input of multiplexer 276. The column address latch signal (CAL) described above can be used to selectively block changes in the external address line A0 from effecting BCA0.

Figure 8:
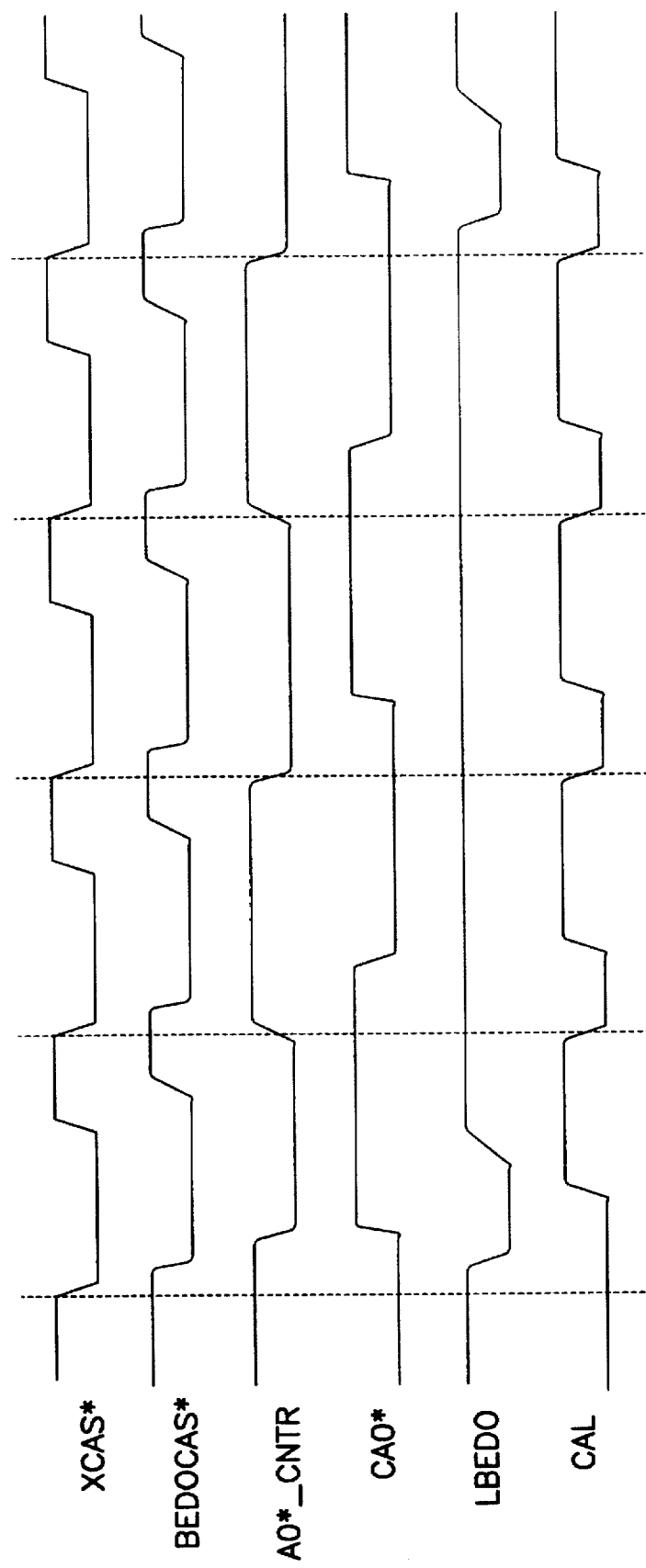
FIG. 8 is a timing diagram of the circuit of FIG. 7.

Referring to the timing diagram of FIG. 8, the operation of the buffer circuit 272 of FIG. 7 is described. During a BEDO operation the first external CAS* signal is used to load the initial column address, including bit A0. Both counter circuit 250 and buffer circuits 272, therefore, latch an initial column address on the first CAS* falling edge. In this example, initial address A0 is a high logic level. The falling edge of BEDOCAS*, a delayed CAS* signal, couples A0 to A0*_CNTR as a low logic level. LBEDO goes low with CAS* and couples address line A0 to BCA0 through multiplexer 276. LBEDO goes high after a time delay following the first falling edge of CAS* and remains high until the burst sequence is completed or terminated. The rising edge of LBEDO switches multiplexer 276 such that the output of multiplexer 274 is coupled to NAND gate 280.

On the first rising edge of BEDOCAS*, the output of feed-back inverter 277 is connected to the output of multiplexer 274. The rising edge of BEDOCAS* is also used to clock counter circuit 250 as described above. On the falling edge of BEDOCAS*, the new A0*_CNTR signal (high level) produced by circuit 250 is coupled to BCA0 and BCA0*. When the CAL signal goes high, the outputs of NAND gates 280 and 282 also go high to latch a column address in NAND gates 178(a) and (b). Conversely, when CAL goes low, the output of multiplexer 276 is passed through gates 280, 282, and 278 to outputs BCA0* AND BCA1*.

The BEDO counter circuit 250 and the buffer circuit 272 simplify the timing of the burst EDO memory circuit by allowing a method to be used in which the column address is advanced by the rising edge of CAS* and then the new advanced column address is latched in an access buffer by using the falling edge of CAS*. This circuitry, therefore, eliminates the need to both advance the column address and access the new column on the falling edge of CAS*. Performing both operation on one system clock (CAS*) cycle substantially slows the memory.

Figure 9:
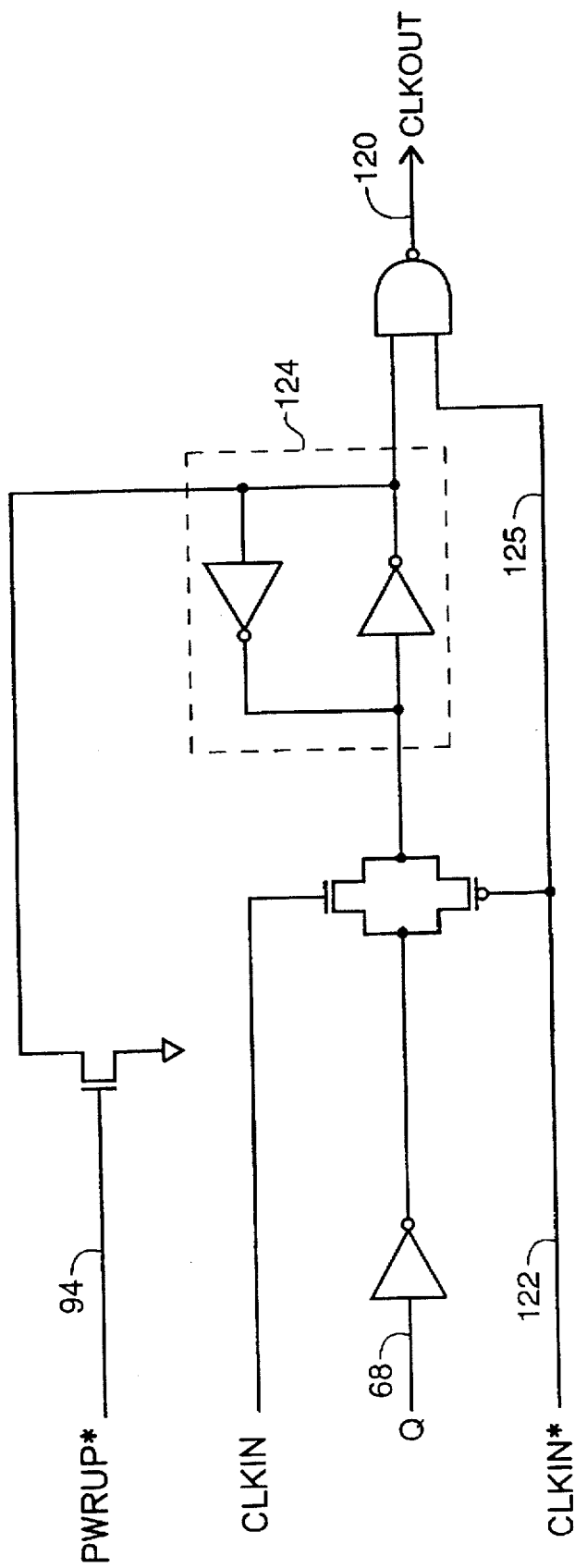
FIG. 9 is a schematic of a shift register circuit of FIG. 7.

FIG. 9 is a schematic representation of an embodiment of the shift registers 254 and 256 of FIG. 6. The output of the clock enable circuit 120 is a logical function of the CLKIN* and the toggle condition signal (Q) received from the multiplexer of FIG. 6. It is desired to provide a glitch free clock signal from the clock enable circuit which will clock a counter element when the clock signal rises (in synchronization with the previous counter element). When the clock signal rises, the input 68 is allowed to pass through to latch 124 and the output is forced high by signal 125. Forcing the output high prevents the output from switching in response to transitions on the input which occur after rising edges of the clock as the counter is advanced. When the input clock signal goes low, if the input 68 was high, the output of latch 124 will be latched high, and the output of the clock enable circuit will go low indicating that the next counter stage is to be clocked on the next rising edge of the clock. When the next rising clock edge occurs, the output of the clock enable circuit will be forced back high, and input 68 which is now low will pass through to hold the output high when the clock transitions back low. Power-up input (PWRUP*) 94 when high will force the clock enable circuit output to a high state, preventing the next counter stage from advancing.

Figure 10:
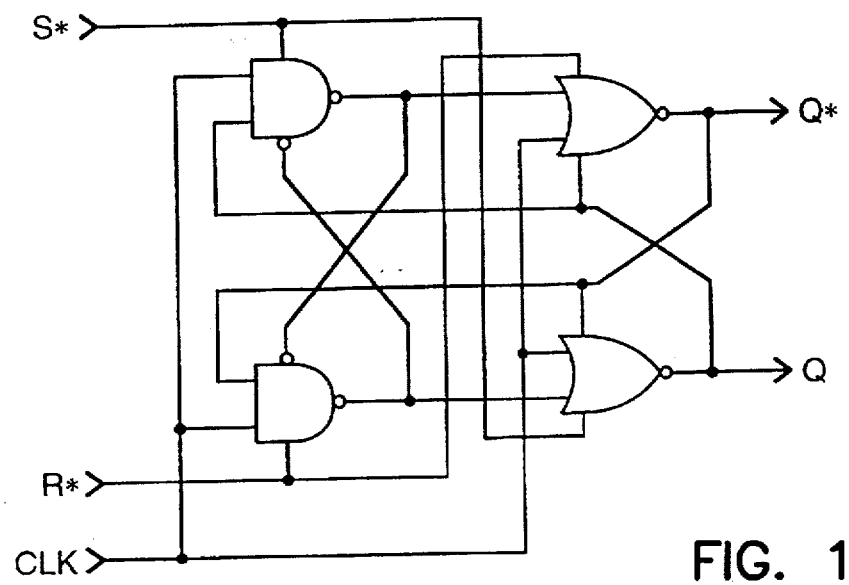
FIG. 10 is a schematic of a flip-flop circuit.
Figure 11:
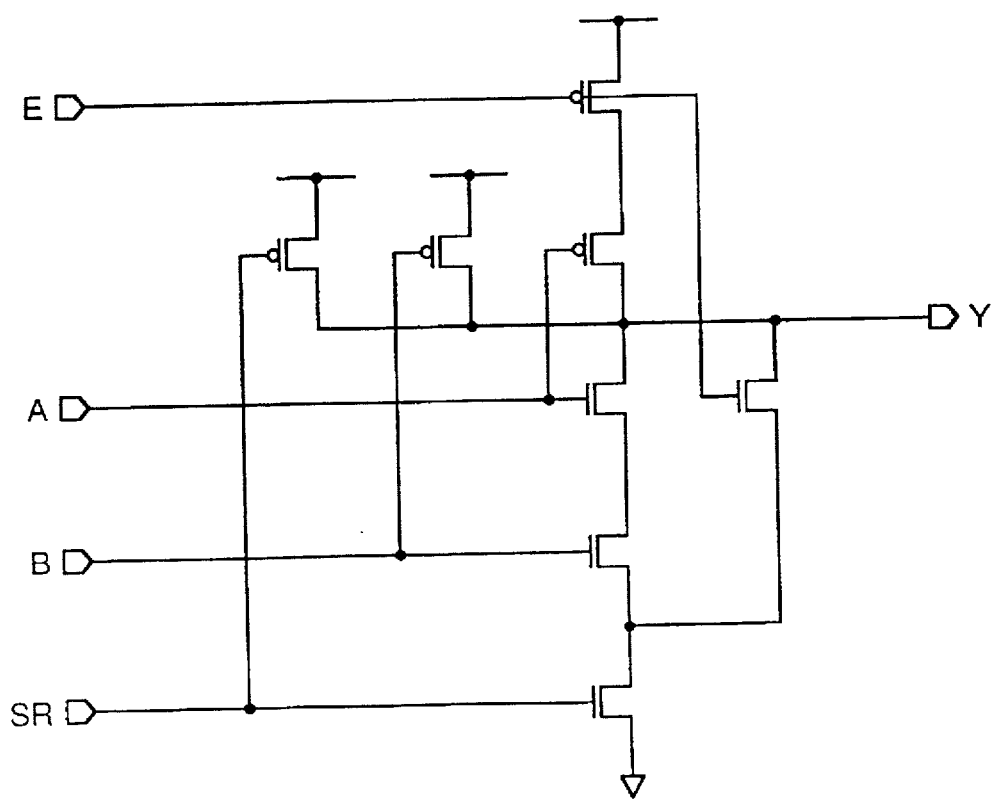
FIG. 11 is a schematic of an enabled NAND gate.
Figure 12:
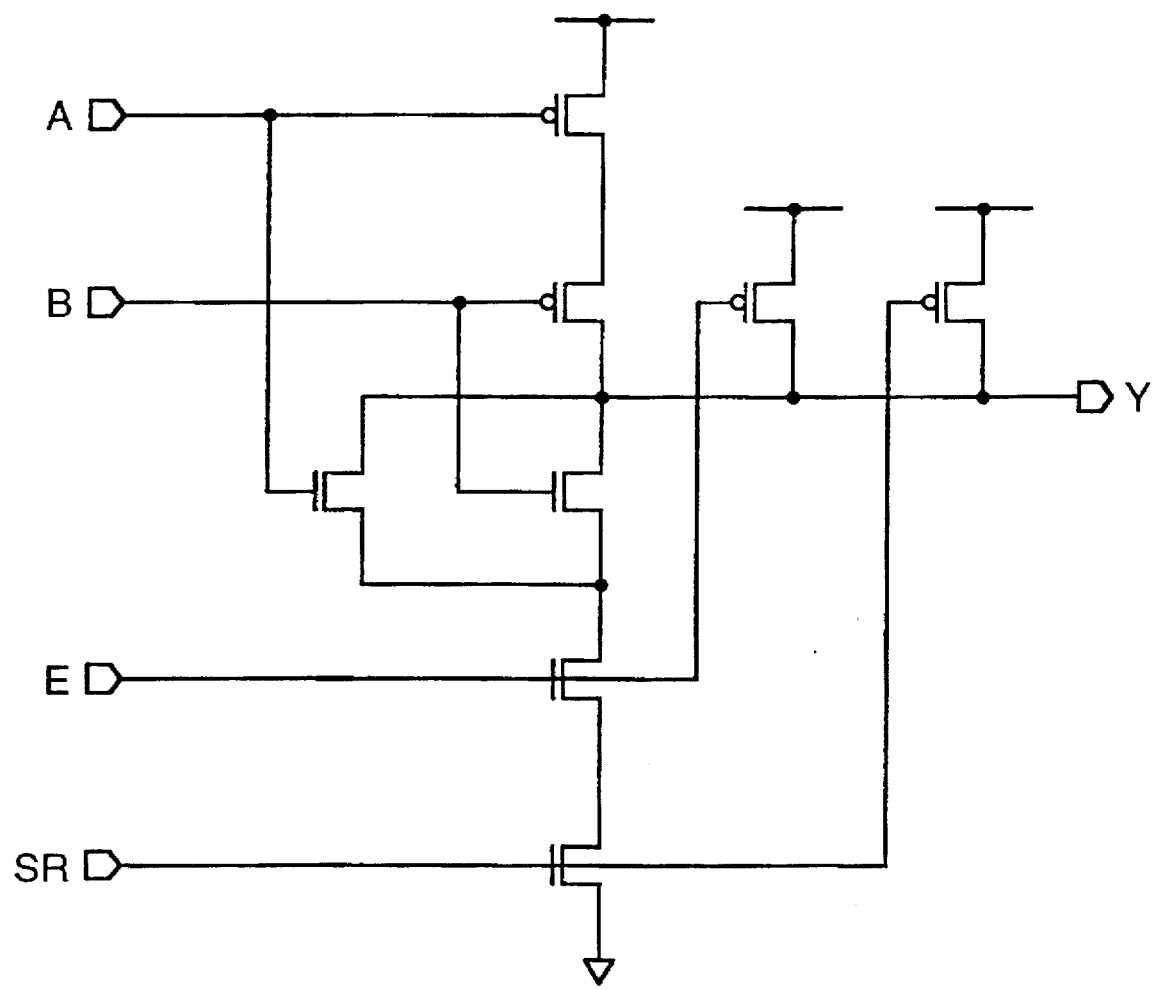
FIG. 12 is a schematic of an enabled NOR gate.

FIG. 10 is a schematic diagram of one embodiment of the flip-flops 252 of FIG. 6. The flip-flop is comprised of two cross coupled Enable NAND gates, and two cross coupled Enable NOR gates. This embodiment of the flip-flop has active low set (S*) and reset (R*) inputs, a clock input, a true output and a compliment output. Examples of Enable NAND and Enable NOR gates are provided in FIGS. 11 and 12 respectively.

Figure 13:
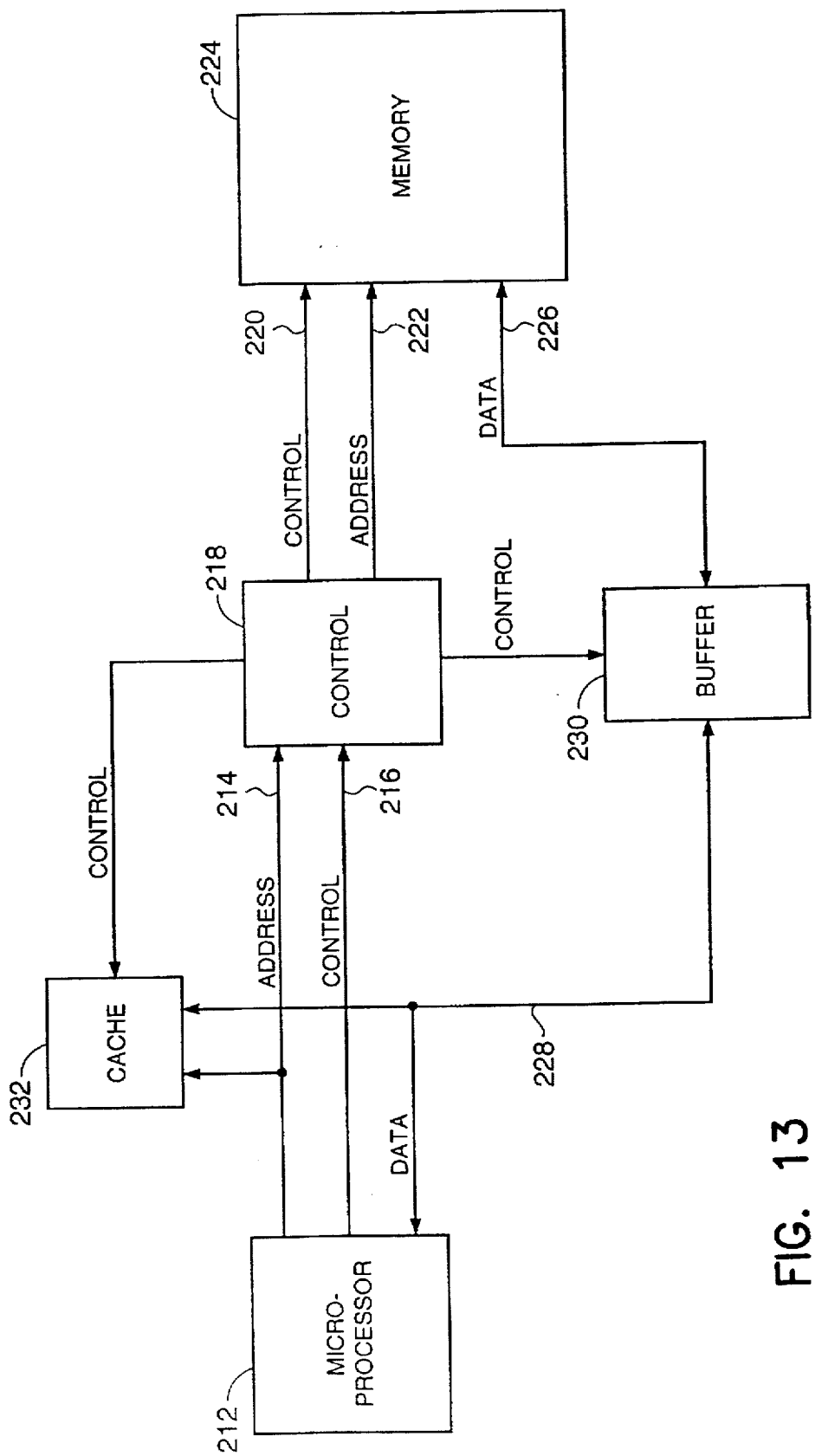
FIG. 13 is a schematic diagram of a system designed in accordance with the present invention.

FIG. 13 is a schematic representation of a data processing apparatus designed in accordance with the present invention. In FIG. 15, microprocessor 212 is connected via address lines 214 and control lines 216 to a memory control circuit 218. The memory control circuit provides address and control signals on lines 222 and 220 respectively to a burst access memory device 224. The burst access memory device sends and receives data over data bus 226. Optional data bus buffer 230 between memory data bus 226 and microprocessor data bus 228 allows for amplification of the data signals, and/or synchronization with the microprocessor and memory control signals. A fast static random access memory (SRAM) cache circuit 232 is also optional and provides higher speed access to data stored in the cache from the microprocessor. Memory control circuit or the microprocessor. Memory control circuit 218 may be incorporated within the microprocessor. The memory control circuit provides the required address strobe signals, address signals and read/write control signals required for burst mode access of the memory circuit. The capability of the processor to access the memory in a burst mode allows for the design of a computer with relatively high memory bandwidth without the requirement of a fast SRAM cache. SRAMs which are fast enough to provide memory access without wait states can significantly add to the cost of a computer. Thus the burst access memory device of the present invention allows for medium to high performance computers to be manufactured at a cost which is significantly less than those manufactured today. Use of the burst access memory device of the present invention in cooperation with a fast SRAM cache allows for an even higher performance computer design by providing fast burst access of main memory in the event of a cache miss.

In operation, the microprocessor reads data from the memory device by supplying address and control signals to the memory device through the memory control circuit. In response to an initial address, a read command and an access cycle strobe, the memory device begins to access a first data word at the initial address. A second access cycle strobe advances the address within the memory device in a second access period of the burst access, and initiates a read access of data from a second address. For a latency of two, the first data is driven from the memory device after the second access cycle strobe signal occurs. Typically the first data is latched in the microprocessor in response to a third access cycle strobe which occurs at the beginning of a third access cycle period of the burst access. The third access cycle strobe also causes the second data value to be driven from the memory device. The third access cycle strobe also causes a third address to be generated within the memory device, and a third data access begins. Data is latched in the microprocessor in response to fourth, fifth and sixth access cycle strobes. In this manner four data values are received in the microprocessor in response to a single address and a plurality of access cycle strobes. The microprocessor may provide a second address to the memory device with the fifth access cycle strobe signal if the memory device is designed to perform four word burst sequences and additional data values are required from the memory. In this case, a second four word burst sequence is begun while the microprocessor is receiving data from the first four word burst. The data buffer 230 may be used to synchronize data from the memory device received in response to the access cycle strobe signal, with a system clock which is connected to the microprocessor. For write cycles, there is typically no latency. Data for write cycles is provided with each access cycle strobe signal in a burst write sequence.

In an alternate embodiment, initial burst access addresses are latched in the memory in response to falling edges of the address strobe, and additional burst addresses are generated within the memory in response to rising edges of the address strobe. The additional addresses are used to perform memory accesses in response to falling edges of the address strobe. In this manner, generation of the address for the next access cycle is begun in advance. This address may be compared with the initial address to detect an end of burst sequence condition. When the burst access is complete or terminated, a new initial address is latched in response to a falling address strobe signal.

For the purposes of this specification a microprocessor may be, but is not limited to, a microprocessor, a microcontroller, a digital signal processor, or an arithmetic processor. A signal may refer to, but is not limited to, information transferred via a conductor, or a conductor for transferring information. A node may refer to, but is not limited to, an input point, an output point, an intersection of conductors, or a point along a conductor.

CONCLUSION

A memory device has been described in detail which can operate in a burst access mode for fast data access rates. The memory device includes an address counter which advances a column address in a predetermined manner during burst operation. The column address starts at an initial address provided on external address lines and advances to the next column address on the rising edge of a CAS* signal. A buffer circuit is included which latches the column address provided by the address counter for use in accessing the column. The buffer circuit is responsive to the falling edge of the CAS* signal. The memory device, therefore, both advances the column address and accesses the new column on one CAS* cycle. By using both the rising and falling edges of the CAS* signal, the memory device to operate within timing constraints for standard DRAM memory devices.

While the present invention has been described with reference to preferred embodiments, numerous modifications and variations of the invention will be apparent to one of skill in the art without departing from the scope of the invention. For example, the clock signal for the flip-flops of counter circuit 250 could be generated using a timing circuit triggered on the falling edge of CAS*. This alternative embodiment allows the two bit counter to be advanced between the falling edges of successive CAS* cycle.

What is claimed is:

1. A memory device having a plurality of addressable memory elements comprising:
    an address counter to receive a first memory element address and adapted to generate a series of memory element addresses in response to a first transition direction of an address latch signal; and
    a buffer circuit to latch the series of memory element addresses in response to a second transition direction of the address latch signal;
    the buffer circuit comprises:
        a first multiplexer circuit having a first input coupled to an output of the address counter;
        a feed back circuit coupled between an output of the first multiplexer circuit and a second input of the first multiplexer circuit; and
        a latch circuit interposed between the output of the first multiplexer circuit and the feedback circuit, and adapted to receive an output of the first multiplexer circuit.

2. The memory device of claim 1 wherein the address latch signal is an active low column address signal (CAS*).

3. The memory device of claim 2 wherein the first transition direction of the address latch signal is a low to high transition in the CAS*.

4. The memory device of claim 2 wherein the second transition direction of the address latch signal is a high to low transition in the CAS*.

5. The memory device of claim 1 wherein the series of memory element addresses is one of a plurality of predetermined burst address sequences.

6. The memory device of claim 5 where the plurality of predetermined burst address sequences comprises an interleaved address sequence and a linear address sequence.

7. The memory device of claim 1 further comprising an address sequence select circuit electrically coupled to the address counter.

8. The memory device of claim 1 wherein the buffer circuit comprises:
    a multiplexer circuit responsive to the address latch signal for receiving and latching the series of memory element addresses.

9. The memory device of claim 8 wherein the buffer circuit further comprises:
    a second multiplexer circuit to latch the first memory element address.

10. An integrated memory circuit comprising:
    a memory array having a plurality of addressable memory cells;
    an address counter to receive a first memory cell address and adapted to generate a series of memory cell addresses in response to a first transition direction of an address latch signal;
    a buffer circuit coupled to the address counter to latch either the first memory cell address or the series of memory cell addresses in response to a second transition direction of the address latch signal; and
    access circuitry to access the memory array in response to an address latched in the buffer circuit;
    the buffer circuit comprises:
        a first multiplexer circuit having a first input coupled to an output of the address counter;
        a feed back circuit coupled between an output of the first multiplexer circuit and a second input of the first multiplexer circuit; and
        a latch circuit interposed between the output of the first multiplexer circuit and the feedback circuit, and adapted to receive an output of the first multiplexer circuit.

11. The integrated memory circuit of claim 10 wherein the address latch signal is an active low column address signal (CAS*).

12. The integrated memory circuit of claim 11 wherein the first transition direction of the address latch signal is a low to high transition in the CAS*.

13. The integrated memory circuit of claim 11 wherein the second transition direction of the address latch signal is a high to low transition in the CAS*.

14. The integrated memory circuit of claim 10 wherein the buffer circuit further comprises:
    a second multiplexer circuit having a first input coupled to an external address input and a second input coupled to the output of the first multiplexer circuit.

15. The integrated memory circuit of claim 10 wherein the address counter comprises:
    a plurality of flip-flops;

a shift register coupled to the plurality of flip-flops; and a multiplexer for enabling one of a plurality of counting sequences.

16. A method of accessing memory elements in a memory device, the method comprising the steps of:

receiving a first memory element address on address inputs;

latching the first memory element address in an address counter;

generating a series of memory element addresses with the address counter in response to a first transition direction of an address latch signal; and latching the series of memory element addresses with a buffer circuit in response to a second transition direction of the address latch signal, the step of latching the series of memory element addresses comprises the sub-steps of:

coupling the first memory element address to a latch in the buffer circuit via a multiplex circuit, coupling an output of the latch through a feedback circuit and the multiplex circuit to an input of the latch on the first transition direction of the address latch signal, and coupling a subsequent memory element address from the address counter to the input of the latch on the second transition direction of the address latch signal.

17. The method of claim 16 further including the step of:

accessing a memory element based upon the series of memory element addresses latched in the buffer circuit in response to the second transition direction of the address latch signal.

18. The method of claim 17 wherein the series of memory element addresses is generated in a selectable one of a plurality of predetermined sequences.

19. The method of claim 16 further including the step of:

latching the first memory element address in the buffer circuit simultaneously with the step of latching the first memory element address in the address counter.

20. A method of accessing memory elements in a memory device, the method comprising the steps of:

receiving a first memory element address on address inputs;

latching the first memory element address in an address counter and a buffer circuit on a first active transition of an address latch signal;

generating a series of memory element addresses with the address counter in response to subsequent in-active transitions of the address latch signal; and latching the series of memory element addresses in the buffer circuit in response to active transitions of the address latch signal, the step of latching the series of memory element addresses comprises the sub-steps of:

coupling the first memory element address to a latch in the buffer circuit via a multiplex circuit, coupling an output of the latch through a feedback circuit and the multiplex circuit to an input of the latch on the active transition of the address latch signal, and coupling a subsequent memory element address from the address counter to the input of the latch on the inactive transition of the address latch signal.

21. The method of claim 20 further including the step of:

accessing a memory element based upon the series of memory element addresses latched in the buffer circuit in response to the second transition direction of the address latch signal.

22. The method of claim 20 wherein the series of memory element addresses is generated in a selectable one of a plurality of predetermined sequences.

* * * * *